US012010799B2

(12) United States Patent
Lewis et al.

(10) Patent No.: US 12,010,799 B2
(45) Date of Patent: Jun. 11, 2024

(54) ELECTRONIC SWITCH MODULE WITH OPPOSITELY-ARRANGED POWER SWITCHES AND DISCRETE HEAT SINKS

(71) Applicant: Black & Decker Inc., New Britain, CT (US)

(72) Inventors: Joshua M. Lewis, Baltimore, MD (US); Michael D. Grove, Windsor, PA (US)

(73) Assignee: Black & Decker Inc., New Britain, CT (US)

( * ) Notice: Subject to any disclaimer, the term of this patent is extended or adjusted under 35 U.S.C. 154(b) by 832 days.

(21) Appl. No.: 16/449,761

(22) Filed: Jun. 24, 2019

(65) Prior Publication Data
US 2020/0006021 A1   Jan. 2, 2020

Related U.S. Application Data

(60) Provisional application No. 62/691,160, filed on Jun. 28, 2018.

(51) Int. Cl.
*H02K 7/14*   (2006.01)
*B25B 21/02*   (2006.01)
(Continued)

(52) U.S. Cl.
CPC ............. *H05K 1/181* (2013.01); *B25B 21/02* (2013.01); *B25F 5/02* (2013.01); *H01H 9/54* (2013.01);
(Continued)

(58) Field of Classification Search
CPC .. B25B 21/02; B25F 5/02; H01H 9/54; H01H 13/14; H01H 13/52; H01H 21/24;
(Continued)

(56) References Cited

U.S. PATENT DOCUMENTS 3,594,523 A   7/1971   Frenzel
4,256,942 A   3/1981   Wied
(Continued)

FOREIGN PATENT DOCUMENTS

CN   108155037 A   6/2018
JP   H11345921 A   * 12/1999   ............. H01L 23/36
(Continued)

OTHER PUBLICATIONS

EP EESR dated Oct. 30, 2019 in corresponding EP application 19181956.4.
(Continued)

*Primary Examiner* — Thomas M Wittenschlaeger
*Assistant Examiner* — David G Shutty
(74) *Attorney, Agent, or Firm* — Amir R. Rohani

(57) ABSTRACT

An electronic module is provided including a circuit board defining a longitudinal axis and having a first surface and a second surface. A module housing is provided having a bottom surface and side walls extending from the bottom surface to form an open face through which the circuit board is received. Power switches configured as an inverter circuit to drive an electric motor are mounted on the second surface of the circuit board facing the bottom surface of the module housing, and a series of heat sinks are discretely mounted on the first surface of the circuit board facing the open face opposite the power switches. Potting material is disposed in the distance between the circuit board and the bottom surface of the module housing to cover the power switches. Thermal vias are disposed through the circuit board between corresponding ones of the heat sinks and the power switches.

20 Claims, 11 Drawing Sheets

(51) Int. Cl.

| | | |
|---|---|---|
| *B25F 5/02* | (2006.01) | |
| *H01H 9/54* | (2006.01) | |
| *H01H 13/14* | (2006.01) | |
| *H01H 13/52* | (2006.01) | |
| *H01H 21/24* | (2006.01) | |
| *H02K 11/30* | (2016.01) | |
| *H02K 11/33* | (2016.01) | |
| *H02K 23/18* | (2006.01) | |
| *H02M 7/48* | (2007.01) | |
| *H02P 6/14* | (2016.01) | |
| *H02P 6/16* | (2016.01) | |
| *H05K 1/02* | (2006.01) | |
| *H05K 1/11* | (2006.01) | |
| *H05K 1/18* | (2006.01) | |
| *H05K 7/14* | (2006.01) | |
| *H05K 7/20* | (2006.01) | |

(52) U.S. Cl.
CPC ............ *H01H 13/14* (2013.01); *H01H 13/52* (2013.01); *H01H 21/24* (2013.01); *H02K 7/145* (2013.01); *H02K 11/33* (2016.01); *H02K 23/18* (2013.01); *H02M 7/48* (2013.01); *H02P 6/14* (2013.01); *H02P 6/16* (2013.01); *H05K 1/0206* (2013.01); *H05K 1/112* (2013.01); *H05K 1/115* (2013.01); *H05K 7/2039* (2013.01); *H01H 2013/525* (2013.01); *H01H 2231/048* (2013.01); *H05K 2201/066* (2013.01); *H05K 2201/10053* (2013.01); *H05K 2201/10166* (2013.01); *H05K 2201/10174* (2013.01); *H05K 2201/10545* (2013.01)

(58) Field of Classification Search
CPC ....... H01H 2013/525; H01H 2231/048; H02K 7/145; H02K 11/33; H02K 23/18; H02M 7/48; H02P 6/14; H02P 6/16; H05K 1/0206; H05K 1/112; H05K 1/115; H05K 1/181; H05K 7/2039; H05K 2201/066; H05K 2201/10053; H05K 2201/10166; H05K 2201/10174; H05K 2201/10545
See application file for complete search history.

(56) References Cited

U.S. PATENT DOCUMENTS

| | | | |
|---|---|---|---|
| 4,286,125 A | 8/1981 | Schaffeler et al. | |
| 4,329,555 A | 5/1982 | Wied | |
| 4,392,172 A | 7/1983 | Foley et al. | |
| 4,454,454 A * | 6/1984 | Valentine | H02P 7/04 327/434 |
| 4,523,176 A | 6/1985 | Leibinger et al. | |
| 4,649,245 A | 3/1987 | Lessig et al. | |
| 4,719,395 A | 1/1988 | Aoi et al. | |
| 4,734,629 A | 3/1988 | Lessig et al. | |
| 4,737,661 A | 4/1988 | Lessig et al. | |
| 5,289,047 A | 2/1994 | Broghammer | |
| 5,467,251 A * | 11/1995 | Katchmar | H05K 1/0206 257/713 |
| 5,506,755 A | 4/1996 | Miyagi et al. | |
| 5,675,231 A | 10/1997 | Becerra et al. | |
| 5,708,566 A * | 1/1998 | Hunninghaus | H05K 1/0206 361/720 |
| 5,801,932 A | 9/1998 | Hwang et al. | |
| 5,981,885 A | 11/1999 | Katoh et al. | |
| 6,031,723 A | 2/2000 | Wieloch | |
| 6,061,240 A | 5/2000 | Butterbaugh et al. | |
| 6,104,105 A | 8/2000 | Schaeffeler et al. | |
| 6,191,477 B1 | 2/2001 | Hashemi | |
| 6,200,407 B1 | 3/2001 | Wieloch et al. | |
| 6,226,183 B1 * | 5/2001 | Weber | H05K 3/0061 174/16.3 |
| 6,259,235 B1 | 7/2001 | Fraidlin et al. | |
| 6,380,502 B1 | 4/2002 | Hirschburger et al. | |
| 6,525,513 B1 | 2/2003 | Zhao | |
| 6,605,778 B2 | 8/2003 | Dörfler et al. | |
| 6,694,631 B2 | 2/2004 | Bone et al. | |
| 6,717,080 B1 * | 4/2004 | Chan | H01H 13/08 200/334 |
| 6,736,220 B1 | 5/2004 | Chan et al. | |
| 6,770,967 B2 | 8/2004 | Barcley | |
| 6,803,683 B2 | 10/2004 | Bone et al. | |
| 6,825,559 B2 | 11/2004 | Mishra et al. | |
| 6,867,493 B2 | 3/2005 | Hashemi et al. | |
| 6,930,885 B2 | 8/2005 | Barcley | |
| 7,023,159 B2 | 4/2006 | Gorti et al. | |
| 7,031,164 B2 | 4/2006 | Yamaguchi | |
| 7,045,884 B2 | 5/2006 | Standing | |
| 7,054,159 B2 * | 5/2006 | Nakamura | H05K 1/0206 174/16.3 |
| 7,075,257 B2 | 7/2006 | Carrier et al. | |
| 7,121,893 B2 | 10/2006 | Broghammer et al. | |
| 7,145,774 B2 | 12/2006 | Campini et al. | |
| 7,186,940 B1 | 3/2007 | Wong | |
| 7,233,497 B2 | 6/2007 | Simon et al. | |
| 7,269,017 B2 | 9/2007 | Berlin et al. | |
| 7,297,891 B2 | 11/2007 | Omori et al. | |
| 7,313,001 B2 | 12/2007 | Broghammer et al. | |
| 7,445,968 B2 | 11/2008 | Harrison et al. | |
| 7,487,844 B2 * | 2/2009 | DeCicco | B25B 21/00 173/217 |
| 7,511,240 B2 * | 3/2009 | Inagaki | H01H 9/063 200/522 |
| 7,528,491 B2 | 5/2009 | Kirby et al. | |
| 7,535,076 B2 | 5/2009 | Kondou et al. | |
| 7,538,424 B2 | 5/2009 | Mullen et al. | |
| 7,767,918 B2 | 8/2010 | Hofmann et al. | |
| 7,813,135 B2 | 10/2010 | Mori et al. | |
| 7,851,909 B2 | 12/2010 | Mishra et al. | |
| 7,852,137 B2 | 12/2010 | Machida et al. | |
| 7,859,079 B2 | 12/2010 | Kondou et al. | |
| 7,982,152 B2 | 7/2011 | Hirose et al. | |
| 7,982,240 B2 | 7/2011 | Machida | |
| 8,004,009 B2 | 8/2011 | Hsieh | |
| 8,071,903 B2 * | 12/2011 | Sato | H01H 13/06 200/522 |
| 8,089,019 B2 * | 1/2012 | Inagaki | H01H 9/04 200/522 |
| 8,164,114 B2 | 4/2012 | Hsieh | |
| 8,274,159 B2 | 9/2012 | Mishra et al. | |
| 8,383,946 B2 * | 2/2013 | Kim | H01L 23/36 361/720 |
| 8,410,387 B2 | 4/2013 | Niklewski et al. | |
| 8,604,376 B2 | 12/2013 | Kong et al. | |
| 8,649,179 B2 * | 2/2014 | Hershberger | F25B 21/02 62/3.2 |
| 8,737,075 B2 | 5/2014 | Yamashita et al. | |
| 8,803,313 B2 | 8/2014 | Mishra et al. | |
| 8,994,342 B2 | 3/2015 | Naito et al. | |
| 9,073,186 B2 | 7/2015 | Kusakawa | |
| 9,226,383 B2 | 12/2015 | Mishra et al. | |
| 9,242,362 B2 | 1/2016 | Abante et al. | |
| 9,314,900 B2 * | 4/2016 | Vanko | H02K 7/145 |
| 9,338,926 B2 | 5/2016 | Sotome et al. | |
| 9,406,915 B2 | 8/2016 | White et al. | |
| 9,450,471 B2 | 9/2016 | Mergener et al. | |
| 9,496,197 B1 | 11/2016 | Micovic et al. | |
| 9,508,498 B2 * | 11/2016 | Forster | H01R 12/718 |
| 9,583,793 B2 | 2/2017 | White et al. | |
| 9,647,594 B2 | 5/2017 | Chen | |
| 9,666,395 B2 | 5/2017 | Watari et al. | |
| 9,726,726 B2 | 8/2017 | Bock et al. | |
| 9,774,229 B1 | 9/2017 | Mergener et al. | |
| 9,787,159 B2 | 10/2017 | Beyerl | |
| 2005/0174706 A1 | 8/2005 | Yuasa et al. | |
| 2007/0205038 A1 | 9/2007 | Tominaga et al. | |
| 2012/0292063 A1 * | 11/2012 | Forster | B25F 5/00 173/18 |
| 2012/0292068 A1 * | 11/2012 | Velderman | H02P 6/14 173/171 |

(56) References Cited

U.S. PATENT DOCUMENTS

| | | | |
|---|---|---|---|
| 2012/0293099 A1* | 11/2012 | Velderman | H02K 11/33 318/400.18 |
| 2012/0293103 A1* | 11/2012 | Forster | H02K 11/33 318/503 |
| 2015/0062825 A1 | 3/2015 | Ossimitz et al. | |
| 2015/0130525 A1 | 5/2015 | Miller et al. | |
| 2015/0221626 A1 | 8/2015 | Motowaki et al. | |
| 2015/0279592 A1* | 10/2015 | Ekstrom | H01H 21/24 200/522 |
| 2015/0280515 A1* | 10/2015 | Ekstrom | H05K 1/181 173/217 |
| 2015/0280516 A1* | 10/2015 | Ekstrom | H02K 9/06 173/217 |
| 2015/0280517 A1* | 10/2015 | Ekstrom | H01H 9/061 361/715 |
| 2015/0282337 A1* | 10/2015 | Ekstrom | G05G 5/03 173/170 |
| 2015/0319840 A1* | 11/2015 | Sanada | H01L 23/13 361/709 |
| 2016/0181892 A1* | 6/2016 | Purohit | B25F 5/008 310/50 |
| 2016/0359392 A1 | 12/2016 | Mergener et al. | |
| 2017/0093308 A1 | 3/2017 | Lo et al. | |
| 2017/0126051 A1 | 5/2017 | Cox et al. | |
| 2017/0149372 A1 | 5/2017 | White et al. | |
| 2017/0271949 A1 | 9/2017 | Mergener et al. | |
| 2017/0373614 A1 | 12/2017 | Lewis et al. | |
| 2017/0373615 A1 | 12/2017 | Lewis et al. | |
| 2018/0191264 A1* | 7/2018 | Lefevre | H01L 25/18 |

FOREIGN PATENT DOCUMENTS

| | | |
|---|---|---|
| JP | 2004172211 A | 6/2004 |
| JP | 2014/220305 A | 11/2014 |

OTHER PUBLICATIONS

EP EESR dated Nov. 29, 2019 in corresponding EP application 19181958.0.

\* cited by examiner

ELECTRONIC SWITCH MODULE WITH OPPOSITELY-ARRANGED POWER SWITCHES AND DISCRETE HEAT SINKS

RELATED APPLICATION

This application claims the benefit of U.S. Provisional Application No. 62/691,160 filed Jun. 28, 2019, which is incorporated by reference in its entirety.

FIELD

This application relates to an electronic module, and in particular to an electronic module coupled to a trigger switch for activating a motor in a power tool.

BACKGROUND

A brushless DC motor includes a rotor for providing rotational energy and a stator for supplying a magnetic field that drives the rotor. Comprising the rotor is a shaft supported by a bearing set on each end and encircled by a permanent magnet (PM) that generates a magnetic field. The stator core mounts around the rotor maintaining an air-gap at all points except for the bearing set interface. Included in the air-gap are sets of stator windings that are typically connected in either a three-phase wye or Delta configuration. Each of the windings is oriented such that it lies parallel to the rotor shaft. Power devices such as MOSFETs are connected in series with each winding to enable power to be selectively applied. When power is applied to a winding, the resulting current in the winding generates a magnetic field that couples to the rotor. The magnetic field associated with the PM in the rotor assembly attempts to align itself with the stator generated magnetic field resulting in rotational movement of the rotor. A control circuit sequentially activates the individual stator coils so that the PM attached to the rotor continuously chases the advancing magnetic field generated by the stator windings. A set of sense magnets coupled to the PMs in the rotor assembly are sensed by a sensor, such as a Hall Effect sensor, to identify the current position of the rotor assembly. Proper timing of the commutation sequence is maintained by monitoring sensors mounted on the rotor shaft or detecting magnetic field peaks or nulls associated with the PM.

In conventional power tools utilizing a universal motor or a brushed permanent magnet motor, a contact switch is typically disposed on the current path from the power source to the motor. U.S. Pat. No. 6,717,080, filed May 22, 2003, described a trigger assembly coupled to a power contact switch on the current path of the motor. Actuation of the trigger by a user closes the contact switch. The contact switch is spring-loaded to reopen once the trigger is released by the user.

US Patent Pub. No. 2015/0280515, filed Mar. 30, 2015, content of which is incorporated herein by reference in its entirety, describes an integrated switch and control module for driving a brushless DC (BLDC) motor in a power tool. This module, in an embodiment, includes a planar circuit board that accommodates a controller, a series of power switches configured as a three-phase inverter circuit, a series of corresponding heat sinks mounted on the power switches, and an input unit coupled to a trigger. In this module, the controller deactivates the inverter circuit when the trigger is not actuated. Specifically, the initial actuation of the trigger generates a signal to power the controller, but the controller does not begin to switch the inverter circuit ON until further actuation of the trigger. With this arrangement, a separate power contact switch need not be provided, which is important given the space limitations associated with placement of a power contact switch in an integrated switch and control module. However, in the event of a failure of the controller or the power switches, the motor is susceptible to run unintentionally, which is a risk to the users.

This section provides background information related to the present disclosure and is not necessarily prior art.

SUMMARY

According to an embodiment of the invention, an electronic module is provided. The electronic module includes a circuit board defining a longitudinal axis and having a first surface and a second surface. A module housing is provided having a bottom surface and side walls extending from the bottom surface to form an open face, where the module housing receives the circuit board through the open face and retains the circuit board within the side walls substantially parallel to the bottom surface and at a distance from the bottom surface. Power switches configured as an inverter circuit to drive an electric motor are mounted on the second surface of the circuit board facing the bottom surface of the module housing, and a series of heat sinks are discretely mounted on the first surface of the circuit board facing the open face opposite the power switches. Potting material is disposed in the distance between the circuit board and the bottom surface of the module housing to cover the power switches. Thermal vias are disposed through the circuit board between corresponding ones of the heat sinks and the power switches.

According to an embodiment, the power switches include high-side power switches disposed between a positive node of a power supply and the electric motor, and low-side power switches disposed between a negative node of the power supply and the electric motor.

According to an embodiment, electronic module includes a main conductive track disposed on the first surface of the circuit board providing a mounting surface for three of the heat sinks that correspond to the high-side power switches, and the main conductive track electrically couples the three heat sinks corresponding to the high-side power switches to the positive node of the power supply.

According to an embodiment, the main conductive track includes an axial portion that extends along the longitudinal axis of the circuit board and on which three of the heat sinks are mounted, and a traversal portion arranged downstream from the heat sinks in the direction of the longitudinal axis of the circuit board.

According to an embodiment, a series of discrete conductive tracks that are electrically-isolated are disposed on the first surface of the circuit board along a row parallel to the longitudinal axis of the circuit board. The discrete conductive tracks provide mounting surfaces for three of the heat sinks corresponding to the low-side power switches.

According to an embodiment, a first group of power switch conductive tracks are disposed on the second surface of the circuit board opposite the main conductive track to provide mounting surfaces for the high-side power switches, and a second group of power switch conductive tracks are disposed on the second surface of the circuit board opposite the row of discrete conductive tracks to provide mounting surfaces for the low-side power switches.

According to an embodiment, drains of the high-side power switches are electrically connected to the first group of power switch conductive tracks, and the thermal vias electrically couple the main conductive track to the first group of power switch conductive tracks. According to an embodiment, drains of the low-side power switches are electrically connected to the second group of power switch conductive tracks, and the thermal vias electrically couple the discrete conductive tracks to the respective ones of the second group of power switch conductive tracks.

According to an embodiment, electronic module further includes a sliding member supported within the module housing and coupled to an actuator outside the module housing, where the actuator causing movement of the sliding member in a direction substantially perpendicular to the longitudinal axis of the circuit board. The electronic module further includes a first conductive body mounted on the first surface of the circuit board and including a terminal tab coupled to the positive node of the power supply, a second conductive body mounted on the first surface of the circuit board in electrical contact with the main conductive track, and a contact switch supported by the first conductive body and pivotably moveable by the sliding member to make contact with the second conductive body with movement of the actuator. According to an embodiment, the second conductive body is mounted on the main conductive track.

According to an embodiment, the first conductive body includes a first pin received through a first through-hole of the circuit board to make electrical contact with a first conductive track on the second surface of the circuit board, and the second conductive body includes a second pin received through a second through-hole of the circuit board to make electrical contact with a second conductive track on the second surface of the circuit board. According to an embodiment, the electronic module further comprises a flyback diode mounted on the second surface of the circuit board electrically connected between the first conductive track and the second conductive track.

According to an embodiment, electronic module includes a controller and a gate driver arranged on the second surface of the circuit board, where the controller is configured to control a switching operation of the power switches via the gate driver.

According to an embodiment, a series of motor terminals is disposed along a peripheral side parallel to the longitudinal axis of the circuit board and electrically coupled to the power switches. According to an embodiment, the heat sinks are disposed along two rows parallel to the longitudinal axis of the circuit board, one of the two rows being adjacent the plurality of motor terminals. According to an embodiment, the power switches are connected to the motor terminals via intermediary conductive tracks disposed in an intermediary layer of the circuit board.

According to an embodiment, a power tool is provided including a housing having a motor housing and a handle portion. The handle portion houses an electronic module as described above, and the motor housing supporting the electric motor.

BRIEF DESCRIPTION OF THE DRAWINGS

Example embodiments of the present invention will become more fully understood from the detailed description given herein below and the accompanying drawings, wherein like elements are represented by like reference numerals, which are given by way of illustration only and thus are not limitative of the example embodiments of the present invention.

DESCRIPTION

Example embodiments will now be described more fully with reference to the accompanying drawings.

Figure 1:
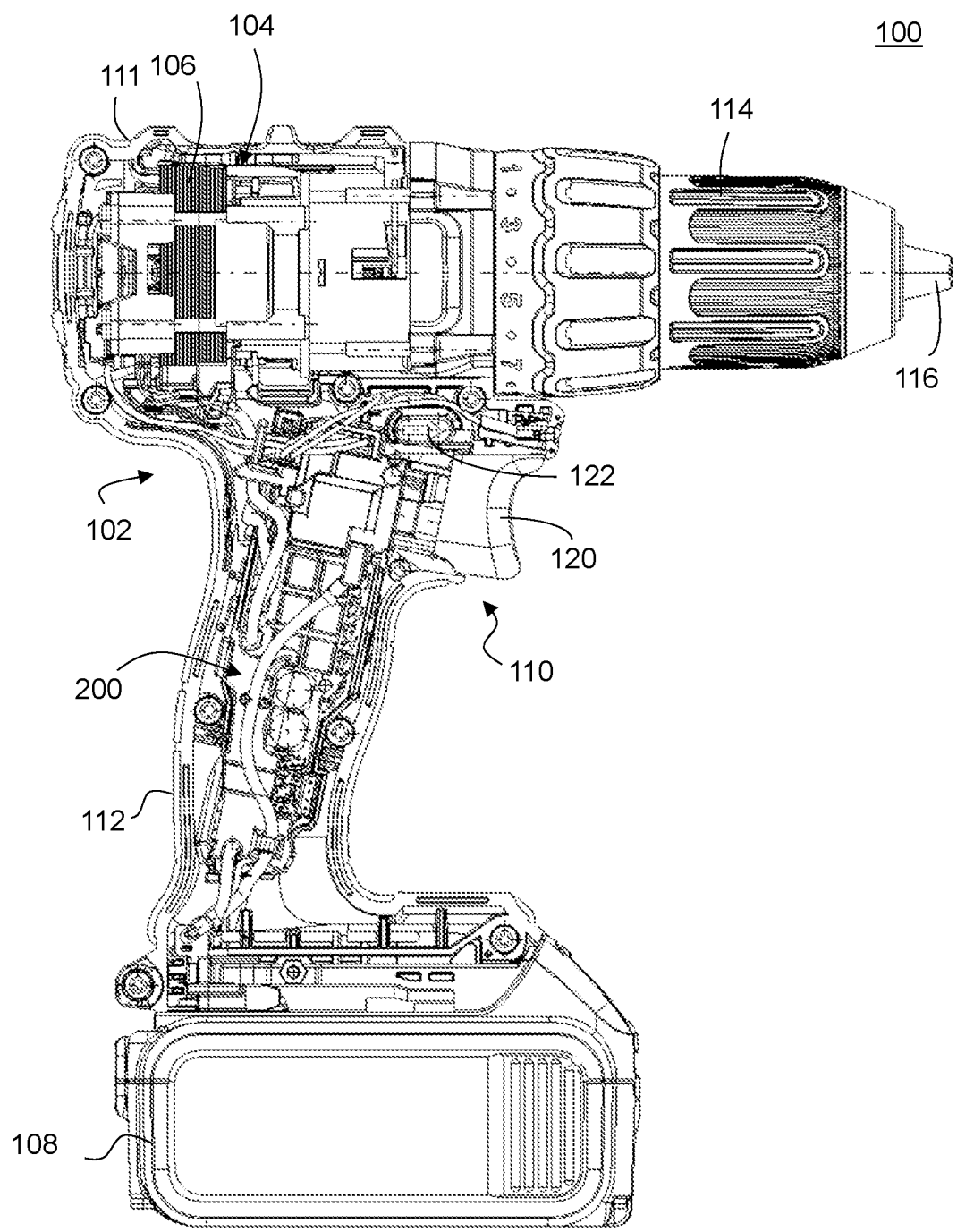
FIG. 1 depicts a longitudinal cross-sectional view of a power tool with a housing half removed, according to an embodiment.

With reference to the FIG. 1, a power tool 100 constructed in accordance with the teachings of the present disclosure is illustrated in a longitudinal cross-section view. Power tool 100 in the particular example provided may be a hand held dill, but it will be appreciated that the teachings of this disclosure is merely exemplary and the power tool of this invention could be any power tool. The power tool shown in FIG. 1 may include a housing 102, an electric motor 104, a battery receptacle for receiving a removable battery pack 108, a transmission assembly (gear case) 114, and an output spindle (not shown) driving a chuck 116. The gear case 114 may be removably coupled to the housing 102. The housing 102 can define a motor housing 111 and a handle 112.

According to an embodiment, motor 104 includes a stator 106 received in motor housing 111. Motor 104 maybe be any type of motor and may be powered by an appropriate power source. In an embodiment, the motor is a brushless DC electric motor including stator 106 and a rotor rotatably received within the stator 106, and it is powered by battery pack 108.

According to an embodiment of the invention, power tool 100 further includes an integrated electronic switch and control module 200 (hereinafter also referred to as "electronic control module", or "control module"). Electronic control module 200, in an embodiment, may include a controller and electronic switching components for regulating the supply of power from the battery pack 108 to motor 106. In an embodiment, electronic control module 200 is disposed within the handle 112 below the motor housing 111, though it must be understood that depend on the power tool shape and specifications, electronic control module 200 may be disposed at any location within the power tool.

Electronic control module may also integrally include components to support a user-actuated input unit 110 (hereinafter referred to as "input unit" 110) for receiving user functions, such as an on/off signal, variable-speed signal, and forward-reverse signal. In an embodiment, input unit 100 may include a variable-speed trigger 120, although other input mechanism such as a touch-sensor, a capacitive-sensor, a speed dial, etc. may also be utilized. In an embodiment, an on/off signal is generated upon initial actuation of the variable-speed trigger 120. In an embodiment, a forward/reverse button 122 is additionally provided on the tool 100. The forward/reverse button 122 may be pressed on either side of the tool in a forward, locked, or reverse position. In an embodiment, the associated circuitry and components of the input unit 110 that support the variable-speed trigger 120 and the forward/reverse button 122 may be fully or at least partially integrated into the electronic control module 200. Based on the input signals from the input unit 110 and associated components, the controller and electronic switching components of the electronic control module 200 modulate and regulate the supply of power from the battery pack 108 to motor 106. Details of the electronic control module 200 are discussed later in detail.

While in this embodiment, the power source is battery pack 108, it is envisioned that the teachings of this disclosures may be applied to a power tool with an AC power source. Such a power tool may include, for example, a rectifier circuit coupled to the AC power source.

It must be understood that, while FIG. 1 illustrates a power tool drill having a brushless motor, the teachings of this disclosure may be used in any power tool, including, but not limited to, drills, saws, nailers, fasteners, impact wrenches, grinders, sanders, cutters, etc. Also, teachings of this disclosure may be used in any other type of tool or product that include a rotary electric motor, including, but not limited to, mowers, string trimmers, vacuums, blowers, sweepers, edgers, etc.

The electronic control module 200 is described herein, according to an embodiment of the invention.

Figure 2A:
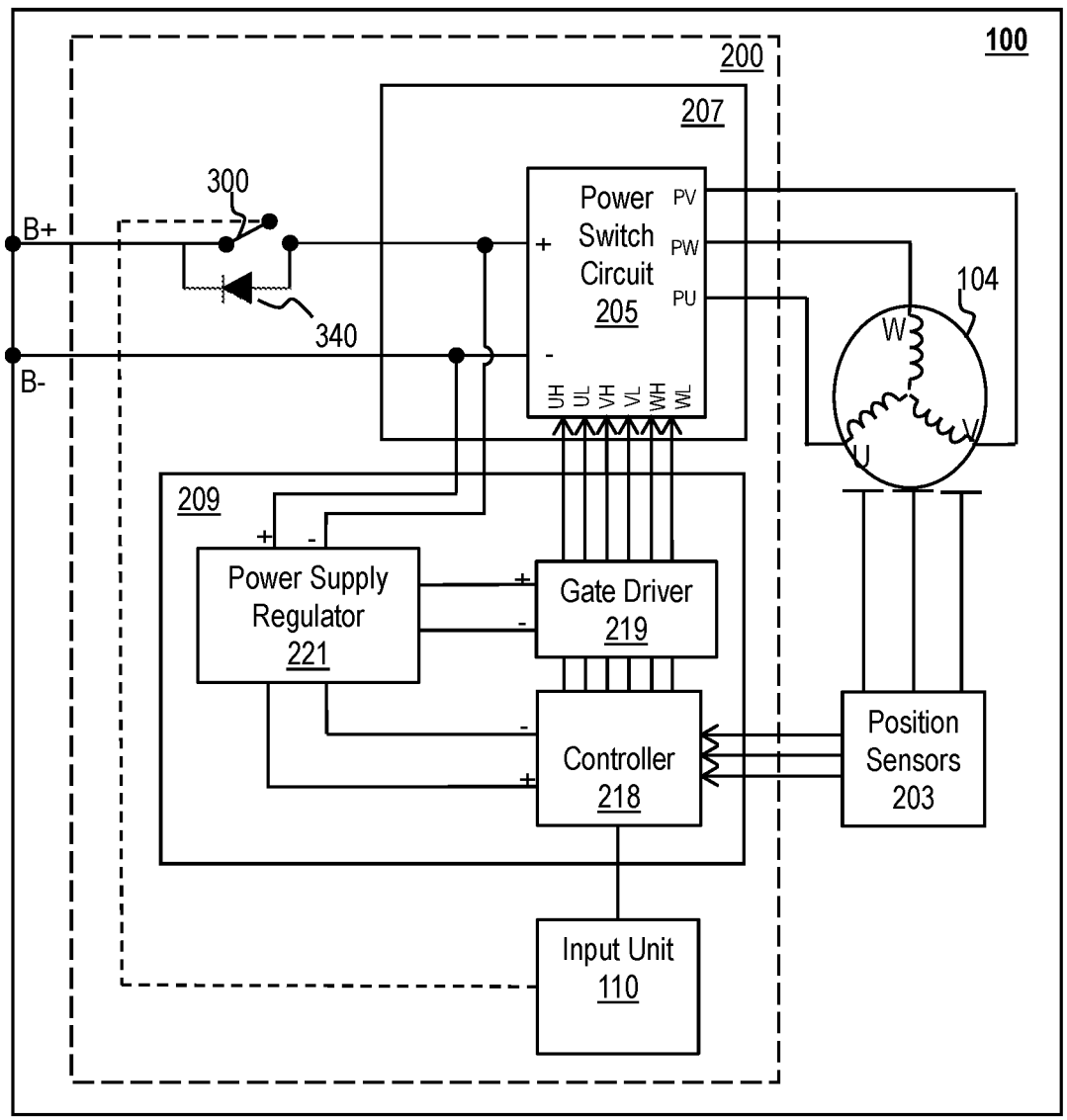
FIG. 2A depicts an exemplary block circuit diagram for an electronic control module for controlling the power tool motor, according to an embodiment.

Referring to FIG. 2A, a circuit block diagram of power tool 100 including motor 104 and electronic control module 200 is depicted, according to an embodiment.

In an embodiment, electronic control module 200 includes the input unit 110, a power unit 207 and a control unit 209. In FIG. 2A, power tool 100 received DC power from a DC power source such as a battery pack via B+ and B− terminals.

In an embodiment, power unit 207 may include a power switch circuit 205 coupled between the power source B+/B− terminals and motor windings to drive BLDC motor 104. In an embodiment, power switch circuit 205 may be a three-phase bridge driver circuit including six controllable semiconductor power devices (e.g. FETs, BJTs, IGBTs, etc.).

In an embodiment, control unit 209 may include a controller 218, a gate driver 219, and a power supply regulator 221. In an embodiment, controller 218 is a programmable device arranged to control a switching operation of the power devices in power switching circuit 226. In an embodiment, controller 218 receives rotor rotational position signals from a set of position sensors 203 provided in close proximity to the motor 104 rotor. In an embodiment, position sensors 203 may be Hall sensors. It should be noted, however, that other types of positional sensors may be alternatively utilized.

In an embodiment, controller 218 is activated by the input unit 110 upon the initial actuation of the trigger 120. The input unit 110 also provides a variable voltage signal indicative of the displacement of the trigger 120 to the controller 218. Based on the rotor rotational position signals from the position sensors 203 and the variable voltage signal, controller 218 outputs drive signals UH, VH, WH, UL, VL, and WL through the gate driver 219, which provides a voltage level needed to drive the gates of the semiconductor switches within the power switch circuit 205 in order to control a PWM switching operation of the power switch circuit 205.

In an embodiment, power supply regulator 221 may include one or more voltage regulators to step down the power supply to a voltage level compatible for operating the controller 218 and/or the gate driver 219. In an embodiment, power supply regulator 221 may include a buck converter and/or a linear regulator to reduce the power voltage of battery down to, for example, 15V for powering the gate driver 219, and down to, for example, 3.2V for powering the controller 218.

In an embodiment, electronic control module 200 includes components and circuitry associated with the user-actuated input unit 110. Such components may detect a movement of the trigger 120 and initiate a signal to turn on the controller and other components of electronic control module 200. In an example, as described in U.S. Pat. No. 9,508,498, content of which is incorporated herein by reference in its entirety, electronic control module 200 may include a series of conductive pads coupled to a series of resistors that output various voltages based on the position of a wiper coupled to the trigger switch. Upon initial engagement of the trigger switch, the output voltage signal (referred to as the WIPER signal in FIG. 12 of the '498 patent, and as the switch signal hereinafter) exhibits a prescribed change in voltage that, though associated circuitry, couples the controller to battery power supply and turns the controller on.

In an embodiment, the switch signal may be active high, meaning that a high voltage signal is generated on the switch signal when the trigger is pressed. Alternatively, and consistent with FIG. 12 of the '498 patent discussed above, the switch signal may be active low, meaning that the voltage signal on Switch Signal is normally a high voltage (e.g., equivalent to the battery voltage), that changes to a lower voltage amount when the trigger is pressed.

In an embodiment, electronic control module 200 is provided with a power contact switch 300 and a flyback diode 340 disposed in parallel to the power contact switch 300. Power contact switch 300 is a contact ON/OFF switch coupled to the trigger 120 and/or the input unit 110. As described later in this disclosure, initial actuation of the trigger 120 closes the power contact switch 300. Power contact switch 300 in this embodiment disables supply of power from the B+ node of the battery terminal to the power switch circuit 205. It is noted, however, that power switch 300 may be provided at a different location, for example, on the B− node of the battery terminal, between one node of the battery and the power supply regulator 221, between the power supply regulator 221 and the gate drivers 232, etc. Power contact switch 300 provides a secondary safety mechanism that ensure that power to the motor 104 is cut off when the trigger 120 is not actuated by the user, even if any of the electronic components (i.e., the electro-mechanical components of the input unit 110, the controller 218, the gate driver 219, or the power switch circuit 205) experience failure. In an embodiment, flyback diode 340 provides a current path for the back-EMF of the motor 104 to flow back to the battery pack, for example, during motor coast or motor braking, when power contact switch 300 is open.

Figure 2B:
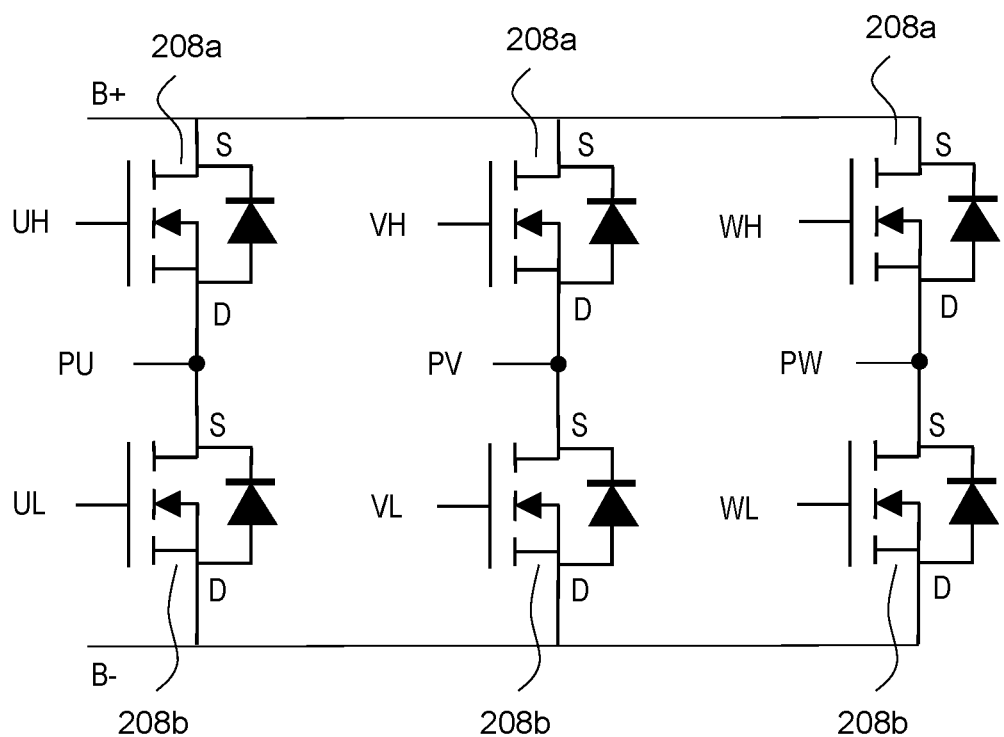
FIG. 2B depicts an exemplary circuit block diagram of an inverter circuit of the electronic control module, according to an embodiment.
Figure 3:
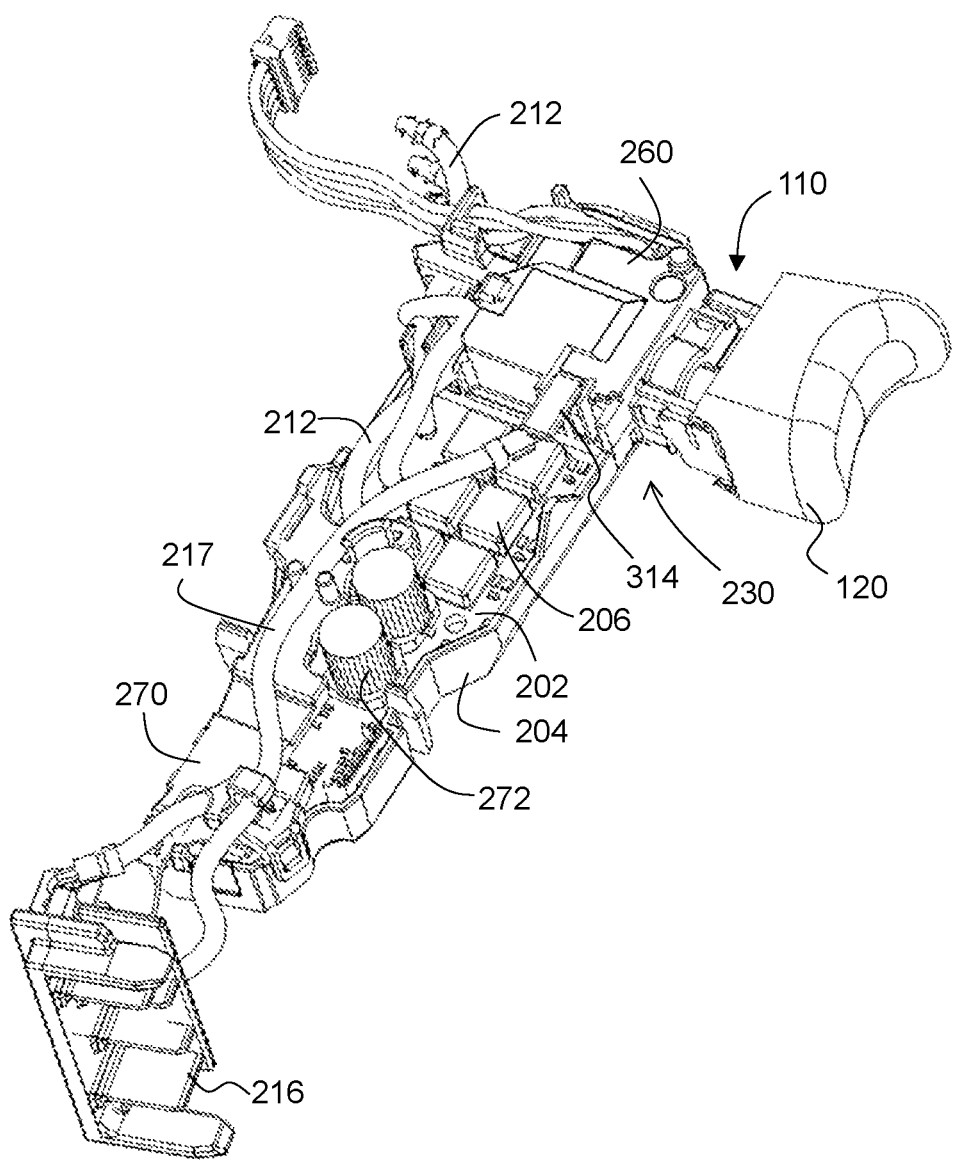
FIG. 3 depicts a perspective view of the electronic control module, according to an embodiment.
Figure 4:
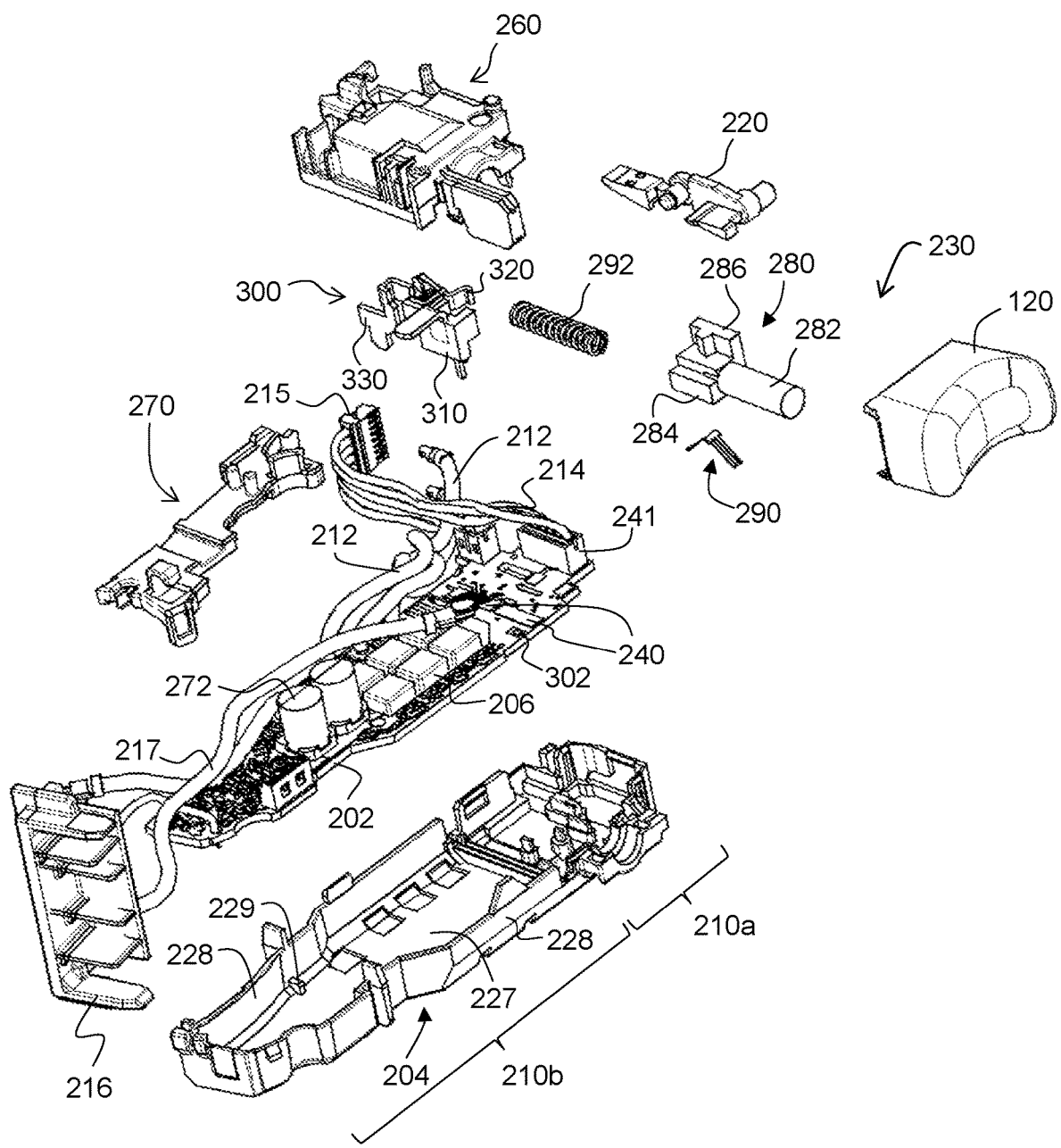
FIG. 4 depicts an exploded view of the electronic control module, according to an embodiment.
Figure 5:
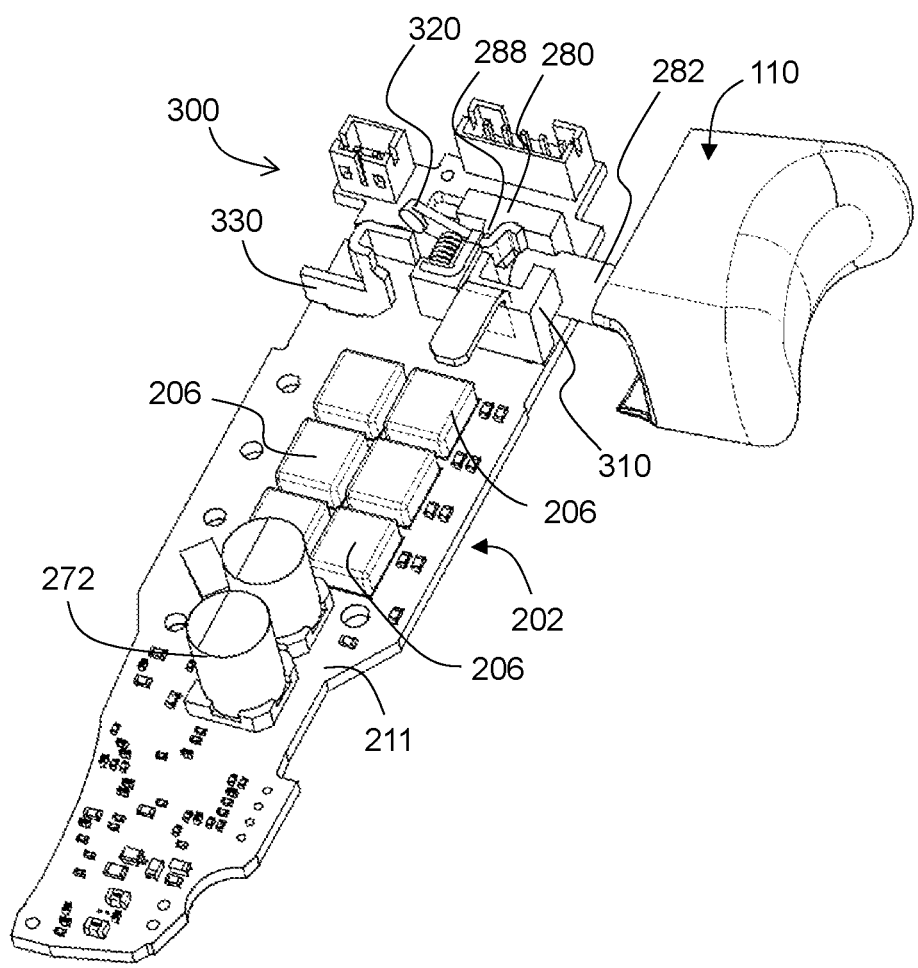
FIG. 5 depicts a top perspective view of a Printed Circuit Board (PCB) and the input unit, including the power contact switch, mounted thereon, according to an embodiment.
Figure 6:
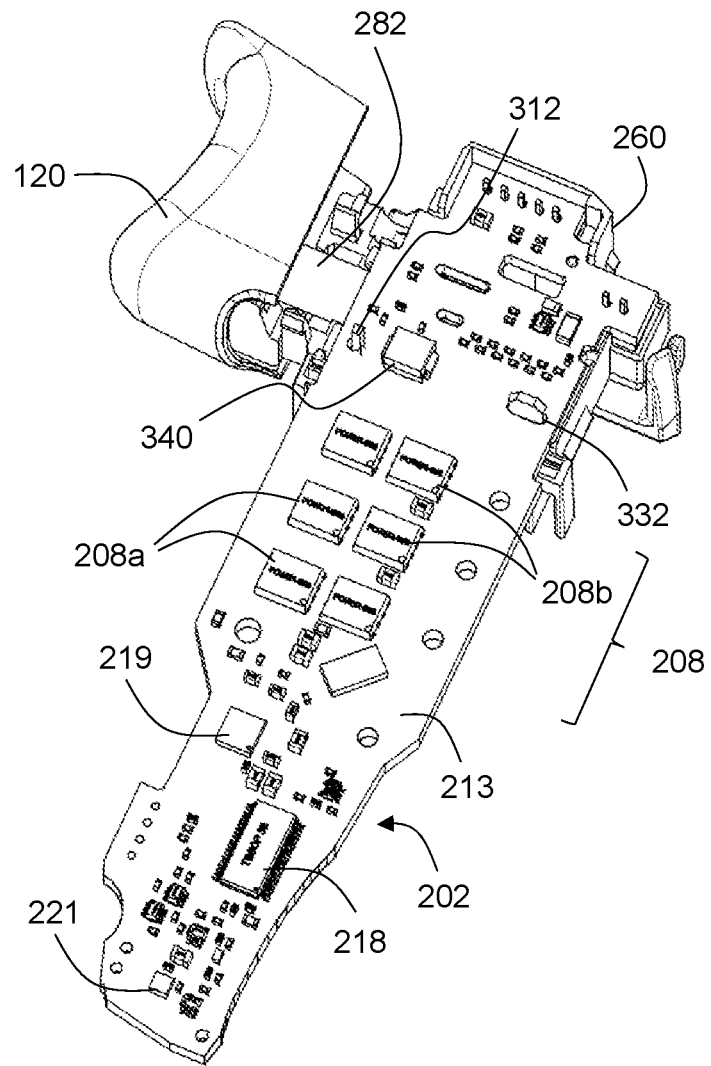
FIG. 6 depicts a bottom perspective view of the PCB, including a flyback diode mounted thereon opposite the power contact switch, according to an embodiment.

FIG. 2B depicts an exemplary circuit block diagram of an inverter circuit of the electronic control module 205, according to an embodiment. As shown herein, the three-phase inverter bridge circuit includes three high-side power switches 208a and three low-side switches 208b. The gates of the high-side power switches 208a are driven via drive signals UH, VH, and WH, and the gates of the low-side power switches 208b are driven via drive signals UL, VL, and WL. In an embodiment, the drains D of the high-side power switches 208a are coupled to the sources S of the low-side power switches 208b to output power signals PU, PV, and PW for driving the BLDC motor 100. Further, the sources S of the high-side power switches 208a are coupled to the B+ node and the drains D of the low-side power switches 208b are coupled to the B− node. By driving the gates of the power switches 208a and 208b, the motor controller 218 controls the phase of the motor being energized and the amount of electric power being delivered Electronic control module 200 is described herein with reference to FIGS. 3-6. FIG. 3 depicts a perspective view of the electronic control module 200, according to an embodiment. FIG. 4 depicts an exploded view of the electronic control module 200, according to an embodiment. FIG. 5 depicts a top perspective view of a Printed Circuit Board (PCB) 202 and the input unit 110 of the electronic control module 200, according to an embodiment. FIG. 6 depicts a bottom perspective view of the PCB 202 and the input unit 110, according to an embodiment.

In summary, in an embodiment, electronic control module 200 generally incorporates elements of the input unit 110, power unit 207 (including power switches 208 including highs-side power switches 208a and low side power switches 208b that are configured as an inverter-switch circuit in power switch circuit 205), and control unit 209 (including controller 218, gate driver 219, power supply regulator 221). In an embodiment, electronic control module 200 further includes power contact switch 300 and flyback diode 340 actuated by the input unit 110.

In an embodiment, electronic control module 200 includes a printed circuit board (PCB) 202 arranged and mounted inside a module housing 204. Module housing 204 includes a bottom surface 227, side walls 228, and an open face. PCB 202 is received through the open face and secured inside the module housing 204. Side walls 228 include retention features 229 for securely holding the PCB 202 at a distance from the bottom surface 227. Electronic control module 200 includes two compartments—an enclosed compartment 210a that houses and encloses a first part of the PCB 202 and components associated with the input unit 110, and an open compartment 210b, and partially encloses a second part of the PCB 202. Within the open compartment 210b, module housing 204 encloses the lower surface 213 and the sides of PCB 202, but it leaves the upper surface 211 of the PCB 202 substantially exposed to airflow. Mounted on a bottom surface of PCB 202 are power switches 208 (which are connected as an inverter circuit to make up the power switch circuit 205), and mounted on a top surface of the PCB 202 are a series of heat sinks 206 disposed opposite the power switches 208. The heat sinks 206 are discretely mounted over the PCB 202 in thermal communication with the power switches 208. As discussed below in detail, this arrangement allows cooling air to transfer heat away from the power switches 208 to the outside environment via the heat sinks 206 while protecting the power switches 208 within an enclosed space of the electronic switch module 200. In an embodiment, the gap between the PCB 202 and the bottom surface 227 of the module housing 204 is filled with potting material that substantially cover the power switches 208 and other components.

In an embodiment, controller 218 is mounted to a lower surface of the PCB 202 and is in electronic communication with gate driver 219, power supply regulator 221 and the rest of the PCB 202 components through metal routings and/or conducive vias. Controller 218 may be programmed to turn on and off power switches 208, as discussed below, to control commutation of the brushless motor.

In an exemplary embodiment, power switches 208 may be Field Effect Transistors (FETs). In an embodiment, six power switches 208, including three high-side power switches and three low-side power switches, are arranged and coupled together as a three-phase bridge rectifier circuit. Using the gate driver 219, controller 218 sequentially turns the power switches 208 on and off within each phase of the brush motor 104 commutation. Further, the controller 218 performs pulse-width modulation (PWM) of the power switches 208 within each phase to regulate the speed of the motor based on speed signals received from input unit 110, as described below. Controller 218 further controls the direction of motor commutation based on a forward/reverse signal received from input unit 110, also discussed below.

It is noted that while the power switches 208 discussed herein are FETs, other types of power switches such as BJTs or IGBTs may be utilized. Additionally, while power switches 208 are arranged as a three-phase bridge rectifier for driving a three-phase brushless motor, other number and arrangement of power switches may be used to drive other types of motors, including brushed or brushless motors.

As described above, module housing 204 leaves the upper surface of the PCB 202 exposed, thus allowing heat to dissipate from the heat sinks 206. Electronic control module 200 may be placed within a path of air flow inside the power tool, e.g., inside the power tool handle 112 in fluid communication with motor fan 106 so that airflow generated by motor fan 106 runs through the handle 112. The air flow generated within the handle further improves heat dissipation from the electronic control module 200.

In an embodiment, the PCB 202 is further potted with a layer of potting compound (not shown) in the open compartment 210b. The layer of potting compound, in an embodiment, substantially covers most of the circuit components on the PCB, but leave a top plate of heat sinks 206 exposed so the heat sinks 206 can dissipate heat away from the power switches 208.

In an embodiment, a bottom surface area of each heat sink 206 has a surface area of 10 to 40 mm$^2$, preferably 15-35 mm$^2$, more preferably 20-30 mm$^2$. This bottom surface is fully mounted on the PCB 202. In an embodiment, each heat sink 206 is in thermal communication with a corresponding one of the power switches 208 via a series of thermal vias. Additionally, in an embodiment, some or all the thermal vias may be electrically conductive, allowing each heat sink 206 to be electrically connected to the drain of the corresponding power switch 208 for more efficient thermal transfer.

In an embodiment, a series of output wires 212 are secured on one end to a surface of the PCB 202. These wires connect the outputs of the power switch circuit 205 (i.e., power switches 208) to the power terminals the brushless motor 104. In an embodiment, a series of control signal wires 214 are also secured to a connector 241 on the PCB 202. The control signal wires 214 allow the controller 218 to communicate with other parts of the power tool 100, such as the motor 104 and the battery 108. In an embodiment, hall signals from the brushless motor positional sensors 203 are coupled via ribbon connector 215 to the control signal wires 214 to communicate with the controller 218. In an embodiment, a pair of power input wires 217 are also secured on the surface of PCB 202. These wires are coupled to a power source (e.g., battery 108) via a power terminal 216 to supply power from the power source to the power switches 208.

In an embodiment, control module 200 includes an encapsulation member 260 that mates with the module housing 204 to form the enclosed compartment 210a of control module 200. Encapsulation member 260 forms the first compartment 210a to protect components associated with input unit 110 from dust and debris. Details relating to the encapsulation member 260 may be found in US Patent Publication No. 2015/0280516, which is incorporated herein by reference in its entirety.

In an embodiment, control module 200 includes an additional cover 270 that covers a lower portion of PCB 202. Cover 270 also includes wire retaining features for retaining the power wires 217, as well as wire guide features for guiding the wires 217 around circuit components (e.g., capacitors 272) mounted on PCB 202.

The input unit 110 is discussed herein, according to an embodiment of the invention. According to an embodiment, input unit 110 is at least partially integrated into control module 200. In an embodiment, input unit 110 incorporates electro-mechanical elements for variable-speed detection, on/off detection, and forward/reverse detection inside the enclosed compartment 210a of control module 200, as discussed herein.

In an embodiment, input unit 110 includes a forward/reverse actuator 220 supported by the enclosed compartment 210a portion of the module housing 204. In an embodiment, forward/reverse actuator 220 pivotably makes or break contact between a pair of conductive tracks on the PCB 202, which is sensed by the controller 218. U.S. Pat. No. 9,508,498 filed May 21, 2012, which is incorporated herein by reference in its entirety, describes such a forward/reverse detection mechanism in more detail.

According to an embodiment, input unit 110 further includes a variable-speed actuator 230. Variable-speed actuator 230 includes a link member 282 that extends out of the module housing 204 from a sliding member 280. Link member 282 is securely coupled to trigger 120 that is engageable by the user. Sliding member 280 is arranged inside the module housing 204 and includes a main body 284 that supports a conductive wiper 290 at its lower surface. The sliding member 280 further includes a pocket 286 that supports and engages a compression spring 292 received through its longitudinal end opposite link member 282. Compression spring 292 is located between an inner wall of the module housing 204 and the sliding member 280. When the user presses the trigger 120, the sliding member 280 moves against a biasing force of the spring 292. The sliding member 284 further includes a rib 288 as described later.

In an embodiment, conductive wiper 290 contacts a speed-sensing member located on the surface of the PCB 202. In an embodiment, the speed-sensing member is a series of variable-speed conductive tracks 240 arranged on the PCB 202. Actuation of the trigger 120 moves the conductive wiper 290 over the conductive tracks 240. Initial movement of the conductive wiper 290 over the conductive tracks 240 generates a signal that turns controller 218 ON. Additionally, an analog variable-voltage signal is generated based on the movement of the conductive wiper 290 over the conductive tracks 240 and that signal is sent to the controller 218. This signal is indicative of the desired motor speed. Functional details of ON/OFF and variable-speed detection using conductive tracks 240 are discuss in U.S. Pat. No. 9,508,498 filed May 21, 2012, which is incorporated herein by reference in its entirety. It must be understood, however, that any known variable-voltage speed-sensing mechanism, such as a resistive tape, may be a utilized within the scope of the invention.

In an embodiment, electronic control module 200 is further provided with power contact switch 300 on the upper surface of the PCB 202. As shown in FIG. 2A, power contact switch 300 is disposed on the current path from the battery terminal B+ to electrically cut off supply of power to the power switch circuit 205. In an embodiment, flyback diode 340 disposed on the lower surface of the PCB 202 and electrically connected in parallel to the power contact switch 300.

Figure 7:
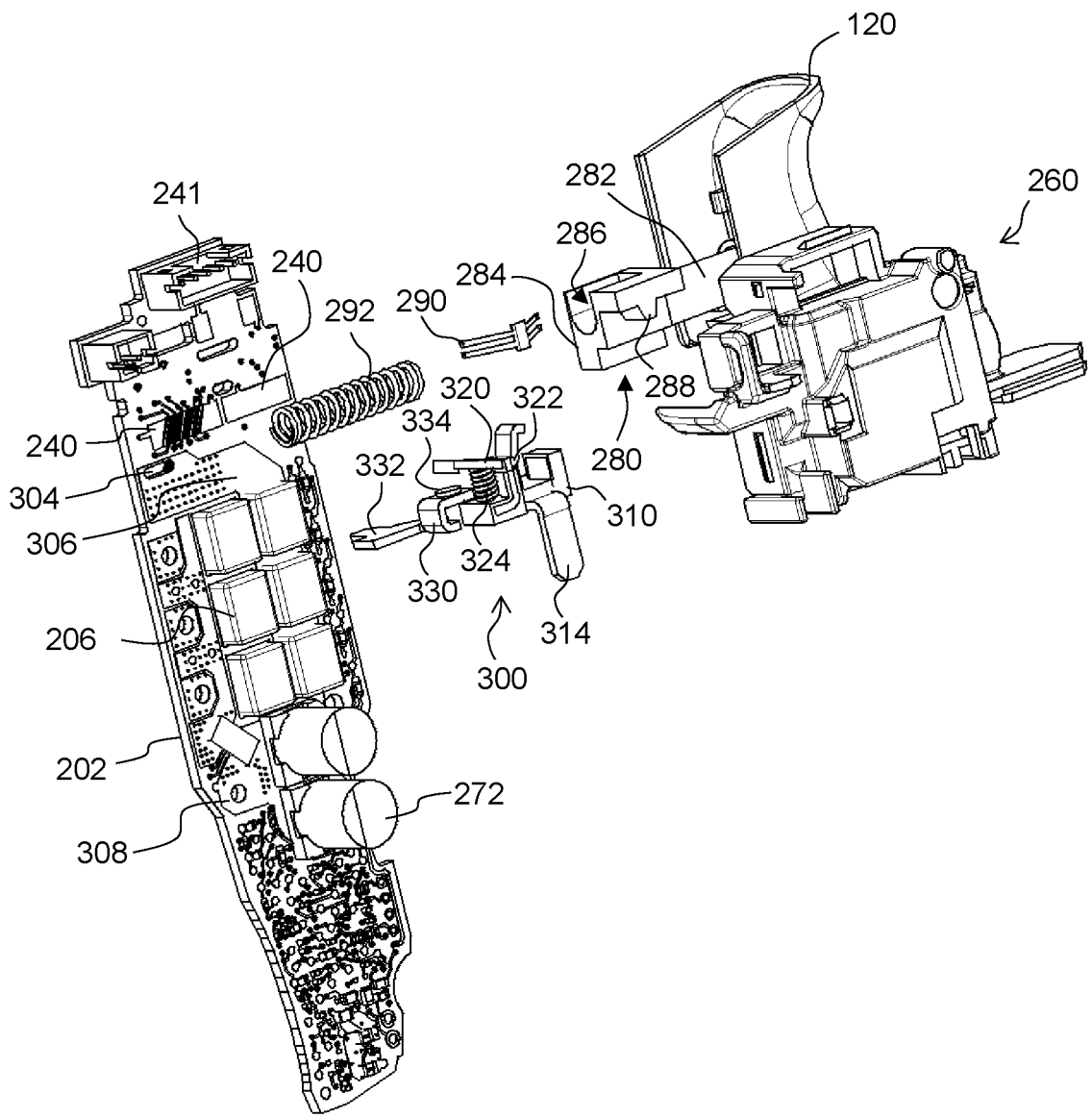
FIG. 7 depicts a top exploded view of the PCB and the input unit, including the power contact switch, according to an embodiment.
Figure 8:
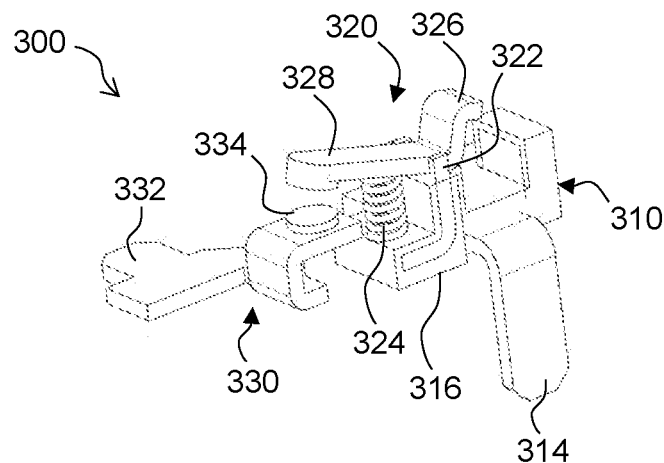
FIGS. 8 and 9 depict perspective views of the power contact switch, according to an embodiment.
Figure 9:
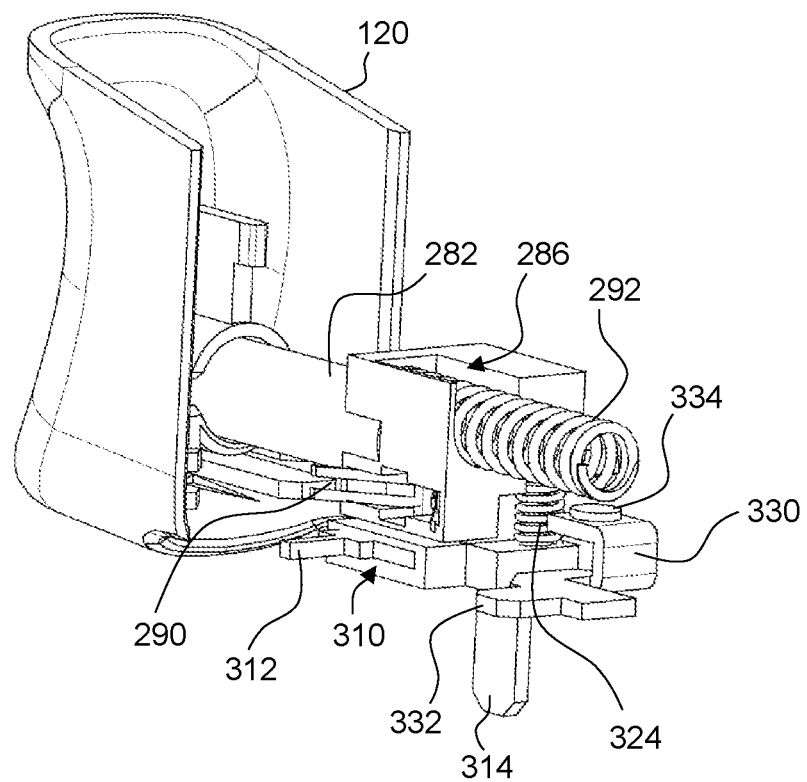

Referring to FIGS. 7-9, and with continued reference to FIGS. 3-6, power contact switch 300 is described herein.

In an embodiment, power contact switch 300 includes a first conductive body 310, a contact switch 320, and a second conductive body 330.

In an embodiment, first conductive body 310 is secured on the upper surface of the PCB 202 via a first pin 312 that is received through a first through-hole 302 of the PCB 202. A terminal tab 314 extends downwardly from an upper portion of the first conductive body 310. Terminal tab 314 extends out of the encapsulation member 260 and is attached to one the B+ power line of the power input wires 217 (see FIG. 3).

In an embodiment, second conductive body 330 is secured on the upper surface of the PCB 202 via a second pin 332 received through a second through-hole 304 of the PCB 202. The second conductive body 330 includes a contact portion 334 positioned in close proximity to the first conductive body 310.

In an embodiment, contact switch 320 is pivotably attached to the first conductive body 310 via a pivot attachment 322, which electrically connects the contact switch 320 to the first conductive body 310. Contact switch 320 includes an engagement leg 326 and a contact leg 328 arranged at approximately a right angle with respect to one another. The pivot attachment 322 is coupled to the attachment point of the engagement leg 326 and the contact leg 328. A compression spring 324 is disposed between the engagement leg 326 and an extension portion 316 of the first conductive body 310. Compression spring 324 biases the engagement leg 326 into contact with contact portion 334 of the second conductive body 330. In an embodiment, the biasing force of the spring 324 is less than that of the spring 292.

In an embodiment, as briefly described above, sliding member 272 of the input unit 110 includes a rib 288. Rib 288 is disposed along an axis normal to a plane of the PCB 202 and is disposed over the main body 284 of the sliding member 272 opposite the conductive wiper 290. In an embodiment, the rib 288 engages the engagement leg 326 when the trigger 120 is released and the sliding member 272 is moved via the biasing force of the spring 292. The rib 288 in this position forces the contact switch 320 to pivot around the pivot attachment 322 against the biasing force of the spring 324, thus breaking contact between the contact leg 328 of the contact switch 320 and the contact portion 334 of the second conductive body 330. In this manner, when the trigger 120 is released, rib 288 breaks contact between the first and second conductive bodies 310 and 330. When the trigger 120 is pressed, the rib 288 disengages the engagement leg 326, and spring 324 biases the contact leg 238 into contact with the contact portion 334 of the second conductive body 330.

In an embodiment, as briefly described above and shown in FIG. 6, flyback diode 340 is mounted on the lower surface of the PCB 202 opposite the power contact switch 300. In an embodiment, flyback diode 340 is electrically connected via conductive tracks provided on the lower surface of the PCB 202 between first pin 312 and second pin 332. In this manner, flyback diode 340 is electrically coupled in parallel across the power contact switch 300.

Referring to FIGS. 2A, 2B, 6 and 7, a main conductive track 306 and a ground conductive track 308 are coupled to the + and − terminals of power switches 208 of the power switch circuit 205. Positive conductive track 306 is disposed around through-hole 304 and is thus electrically connected to the second conductive body 330 of the power contact switch 300. In an embodiment, ground conducive track 308 is coupled to one of the power input wires 217 to receive the B− power line from the battery.

Figure 10:
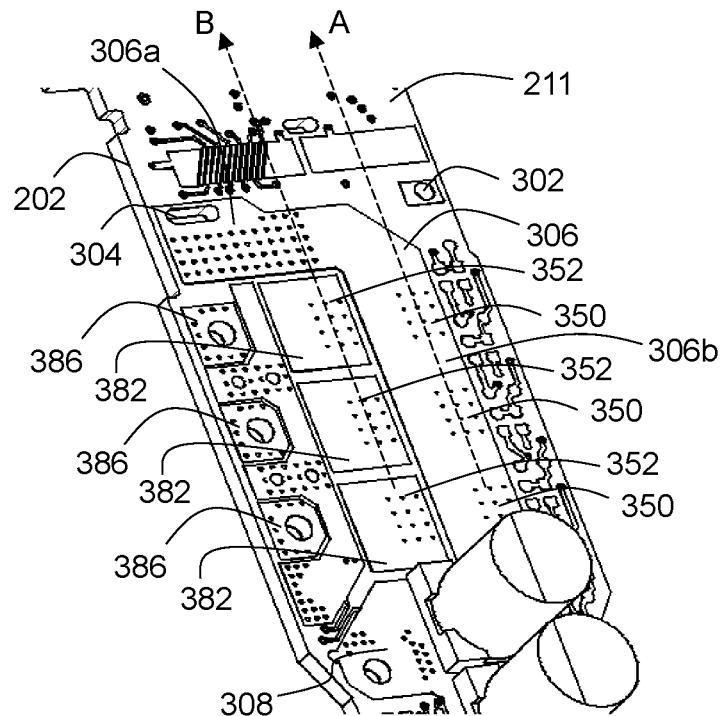
FIGS. 10 and 11 depict perspective views of the upper and lower surface of the PCB, according to an embodiment.
Figure 11:
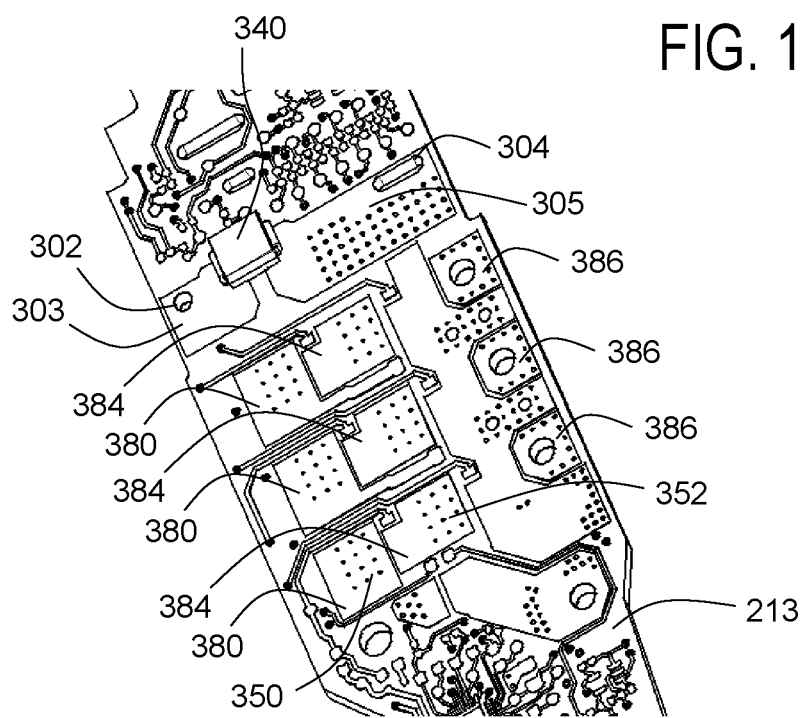
Figure 12:
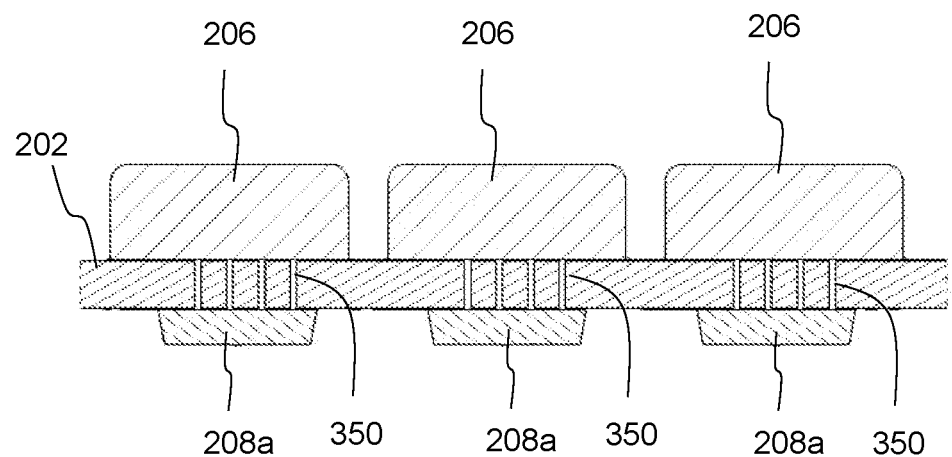
FIG. 12 depicts a cross-sectional view of the PCB 202 along a first plane, according to an embodiment.
Figure 13:
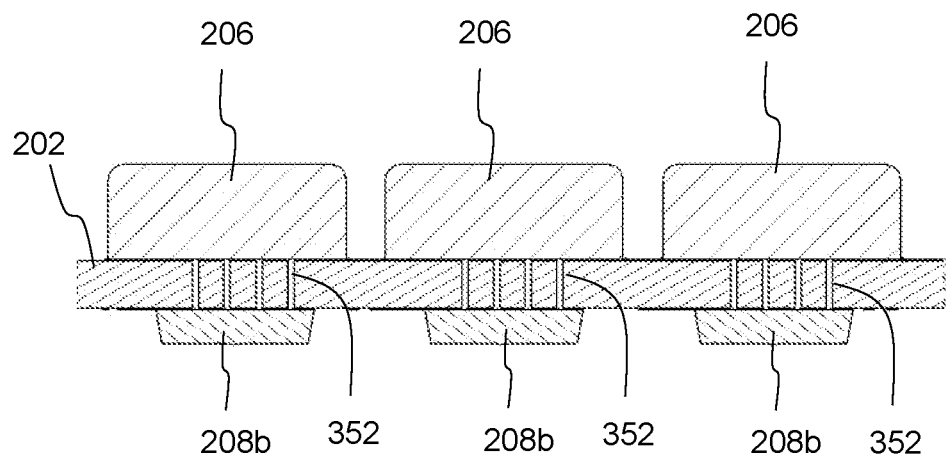
FIG. 13 depicts a cross-sectional view of the PCB 202 along a second plane, according to an embodiment.

FIGS. 10 and 11 depict zoomed-in perspective views of the upper surface 211 and lower surface 213 of the PCB 202 without the power switches 208 and heat sinks 206, according to an embodiment. FIG. 12 depicts a cross-sectional view of the PCB 202 along a first plane intersecting arrow A, according to an embodiment. FIG. 13 depicts a cross-sectional view of the PCB 202 along a second plane intersecting arrow B, according to an embodiment.

As shown herein, lower conductive tracks 303 and 305 on the lower surface of the PCB 202 couple the pins 332 and 312 to the flywheel diode 340.

In an embodiment, in the axial direction of arrow A of the PCB 202 towards the input unit 110, a traversal portion 306a of the main conductive track 306 is disposed downstream of the heat sinks 206, and an axial portion 306b of the main conductive track 306 is disposed in-line with the heat sinks 206 along the axis A to provide a mounting surface for three of the (high-side) heat sinks 206. In an embodiment, the three high-side heat sinks 206 are at the same electrical potential as the + node of the power switch circuit 205. In an embodiment, ground conductive track 308 is disposed upstream of the heat sinks 206 in the axial direction A of the PCB 202.

In an embodiment, traversal portion of the main conductive tracks 306 on the upper surface of the PCB is electrically connected to lower conductive track 305 via a series of conductive vias. In an embodiment, the axial portion of the main conductive track 306, which extends under the three of the (high-side) heat sinks 206, is connected to power switch conductive tracks 380 on the lower surface of the PCB 202. The three high-side power switches 208a are mounted on the lower surface 213 of the PCB 202 at least partially over corresponding power switch conductive tracks 380, with the drains D of the high-side power switches 208a making electrical contact with corresponding power switch conductive tracks 380. This arrangement allows the three (high-side) heat sinks 206 to be electrically connected to the drains of the high-side power switches 208a via main conductive track 306 and power switch conductive tracks 380, thus increasing thermal conductivity from the high-side power switches 208a. In an embodiment, a series of 12 conductive vias 350 are arranged between each power switch conductive track 380 and the main conductive track 306 to thermally connect each high-side power switch 208a to the corresponding heat sinks 206.

In an embodiment, three discrete conductive tracks 382 are provided on the upper surface of the PCB 202, on which three of the (low-side) heat sinks 206 are mounted. Opposite the discrete conductive tracks 382 are provided three power switch conductive tracks 384. The low-side power switches 208b are mounted at least partially on the three power switch conductive tracks 384. In an embodiment, drains D of the low-side power switches 208b are electrically connected to the three power switch conductive tracks 384 for increased thermal transfer. Discrete conductive tracks 382 and power switch conductive tracks 384 are electrically connected via a series of conductive vias 352 (in this example, 12 vias per heat sink 206). These conductive vias 352 may be electrically and/or thermally conductive to increase thermal conductivity from the low-side power switches 208 to the corresponding heat sinks 206.

In an embodiment, corresponding high-side and low-side power switches 208 are connected as an inverter circuit via intermediary conductive tracks (not shown) disposed in an intermediary layer of the PCB 202 to motor terminals 386 disposed along a peripheral side of the PCB 202 adjacent and parallel to the power switches 208. Output wires are secured, via, for example soldering or other known method, to the terminals 386. Arrangement of the motor terminals 386 on along the periphery of the PCB 202, rather than, for instance, between the corresponding power switches 208, eases the manufacturing and assembly process. Additionally, this arrangement allows disposition of larger conductive tracks on the terminals 386, which carry high motor current, and thus increase thermal efficiency of the power switch circuit 205.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "bottom," "lower," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The invention claimed is:

1. An electronic module comprising:
    a circuit board defining a longitudinal axis and having a first surface and a second surface;
    a module housing having a bottom surface and a plurality of side walls extending from the bottom surface to form an open face, the module housing receiving the circuit board through the open face and retaining the circuit board within the side walls substantially parallel to the bottom surface and at a distance from the bottom surface;
    a plurality of power switches configured as an inverter circuit to supply power from a power supply to an electric motor and mounted on the second surface of the circuit board facing the bottom surface of the module housing, wherein the plurality of power switches comprises a plurality of high-side power switches disposed between a positive node of the power supply and the electric motor and a plurality of low-side power switches disposed between a negative node of the power supply and the electric motor;
    a plurality of heat sinks discretely mounted on the first surface of the circuit board facing the open face, the plurality of heat sinks being arranged opposite the plurality of power switches and electrically coupled to drains of the plurality of power switches;
    potting material disposed in the distance between the circuit board and the bottom surface of the module housing to cover the plurality of power switches;
    a plurality of thermal vias disposed through the circuit board between corresponding ones of the plurality of heat sinks and the plurality of power switches to thermally and electrically couple the plurality of heat sinks and the plurality of power switches;
    a main conductive track disposed on the first surface of the circuit board providing a mounting surface for three of the plurality of heat sinks corresponding to the high-side power switches, the main conductive track electrically coupling the three of the plurality of heat sinks corresponding to the high-side power switches to the positive node of the power supply;
    a sliding member supported within the module housing and coupled to an actuator outside the module housing, the actuator causing movement of the sliding member in a direction substantially perpendicular to the longitudinal axis of the circuit board;
    a first conductive body mounted on the first surface of the circuit board and including a terminal tab coupled to the positive node of the power supply;
    a second conductive body mounted on the first surface of the circuit board in electrical contact with the main conductive track; and
    a contact switch supported by the first conductive body and pivotably moveable by the sliding member to make contact with the second conductive body with movement of the actuator.

2. The electronic module of claim 1, wherein the main conductive track includes an axial portion that extends along the longitudinal axis of the circuit board and on which three of the plurality of heat sinks are mounted, and a traversal portion arranged at a distance from the plurality of heat sinks in a direction traverse of the longitudinal axis of the circuit board.

3. The electronic module of claim 1, further comprising a plurality of discrete conductive tracks being electrically-isolated and disposed on the first surface of the circuit board along a row substantially parallel to the longitudinal axis of the circuit board, the plurality of discrete conductive tracks providing mounting surfaces for three of the plurality of heat sinks corresponding to the low-side power switches.

4. The electronic module of claim 1, wherein the second conductive body is mounted on the main conductive track.

5. The electronic module of claim 1, wherein
    the first conductive body includes a first pin received through a first through-hole of the circuit board to make electrical contact with a first conductive track on the second surface of the circuit board,
    the second conductive body includes a second pin received through a second through-hole of the circuit board to make electrical contact with a second conductive track on the second surface of the circuit board, and
    the electronic module further comprises a flyback diode mounted on the second surface of the circuit board and electrically connected between the first conductive track and the second conductive track.

6. An electronic module comprising:
    a circuit board having a first surface and a second surface;
    a plurality of power switches configured as an inverter circuit to supply power from a power supply to an electric motor, wherein the plurality of power switches comprises a plurality of high-side power switches disposed between a positive node of the power supply and the electric motor and a plurality of low-side power switches disposed between a negative node of the power supply and the electric motor;
    a plurality of heat sinks comprising at least one first heat sink and a plurality of second heat sinks discretely mounted on the first surface of the circuit board;
    a main conductive track disposed on the first surface of the circuit board, wherein the at least one first heat sink is mounted on the main conductive track and the plurality of high-side power switches is mounted on the second surface of the circuit board opposite the at least one first heat sink and the main conductive track; and
a plurality of discrete conductive tracks being electrically-isolated and disposed on the first surface of the circuit board along a row substantially parallel to the main conductive track, wherein the plurality of second heat sinks is mounted respectively on the plurality of discrete conductive tracks and the plurality of low-side power switches is mounted on the second surface of the circuit board opposite the plurality of second heat sinks and the plurality of discrete conductive tracks.

7. The electronic module of claim 6, further comprising a module housing having a bottom surface and a plurality of side walls extending from the bottom surface to form an open face, the module housing receiving the circuit board through the open face and retaining the circuit board within the side walls substantially parallel to the bottom surface and at a distance from the bottom surface, wherein the plurality of low-side power switches face the bottom surface of the module housing.

8. The electronic module of claim 7, further comprising potting material disposed in the distance between the circuit board and the bottom surface of the module housing to cover the plurality of power switches.

9. The electronic module of claim 6, further comprising a plurality of thermal vias disposed through the circuit board between corresponding ones of the plurality of heat sinks and the plurality of power switches to thermally and electrically couple the plurality of heat sinks and the plurality of power switches.

10. The electronic module of claim 6, wherein the main conductive track includes an axial portion that extends along a longitudinal axis of the circuit board and on which the at least one first heat sink is mounted, and a traversal portion arranged at a distance from the plurality of heat sinks in a direction traverse of the longitudinal axis of the circuit board.

11. The electronic module of claim 10, further comprising a power contact switch partially mounted on the traversal portion of the main conductive track.

12. The electronic module of claim 6, further comprising a first plurality of power switch conductive tracks disposed on the second surface of the circuit board opposite the main conductive track to provide mounting surfaces for the plurality of high-side power switches, and a second plurality of power switch conductive tracks disposed on the second surface of the circuit board opposite the plurality of discrete conductive tracks to provide mounting surfaces for the plurality of low-side power switches.

13. The electronic module of claim 12, wherein drains of the plurality of high-side power switches are electrically connected to the first plurality of power switch conductive tracks, and the first plurality of power switch conductive tracks is electrically and thermally coupled to the main conductive track via a plurality of thermal vias.

14. The electronic module of claim 12, wherein drains of the plurality of low-side power switches are electrically connected to the second plurality of power switch conductive tracks, and the second plurality of power switch conductive tracks is electrically and thermally coupled to the plurality of discrete conductive tracks via a plurality of thermal vias.

15. The electronic module of claim 6, further comprising:
a sliding member coupled to an actuator;
a first conductive body mounted on the first surface of the circuit board and including a terminal tab coupled to the positive node of the power supply;
a second conductive body mounted on the first surface of the circuit board in electrical contact with the main conductive track; and
a contact switch supported by the first conductive body and pivotably moveable by the sliding member to make contact with the second conductive body with movement of the actuator.

16. The electronic module of claim 6, further comprising a controller and a gate driver arranged on the second surface of the circuit board, the controller being configured to control a switching operation of the plurality of power switches via the gate driver.

17. The electronic module of claim 6, comprising a plurality of motor terminal tracks disposed along a peripheral side of the circuit board, the plurality of motor terminal tracks being electrically coupled to the plurality of power switches.

18. The electronic module of claim 17, wherein the at least one first heat sink and the plurality of second heat sinks are provided apart from the plurality of motor terminal tracks.

19. The electronic module of claim 17, wherein the plurality of discrete conductive tracks is provided between the main conductive track and the plurality of motor terminal tracks.

20. A power tool comprising:
a housing including a motor housing and a handle portion, the handle portion housing an electronic module according to claim 6, and the motor housing supporting the electric motor.

* * * * *